United States Patent
Hanyu et al.

(10) Patent No.: US 7,054,190 B2
(45) Date of Patent: May 30, 2006

(54) LOGIC-IN-MEMORY CIRCUIT USING MAGNETORESISTIVE ELEMENT

(75) Inventors: Takahiro Hanyu, Sendai (JP); Hiromitsu Kimura, Sendai (JP)

(73) Assignee: Tohoku Techno Arch Co., Ltd. (JP)

( * ) Notice: Subject to any disclaimer, the term of this patent is extended or adjusted under 35 U.S.C. 154(b) by 0 days.

(21) Appl. No.: 10/914,807

(22) Filed: Aug. 10, 2004

(65) Prior Publication Data

US 2005/0174837 A1    Aug. 11, 2005

(30) Foreign Application Priority Data

Feb. 19, 2004    (JP)    ............ 2004-043359

(51) Int. Cl.
*G11C 11/14*    (2006.01)

(52) U.S. Cl. .......................... 365/171; 365/158
(58) Field of Classification Search ............. 365/171, 365/158
See application file for complete search history.

(56) References Cited

U.S. PATENT DOCUMENTS 5,640,343 A * 6/1997 Gallagher et al. .......... 365/171
6,538,921 B1 * 3/2003 Daughton et al. .......... 365/171
6,777,730 B1 * 8/2004 Daughton et al. .......... 365/158

OTHER PUBLICATIONS

"Computational RAM: Implementing Processors in Memory" Elliott et al., *IEEE Design & Test of Computers*, 1999, pp. 32-41.
"Proposal for Four-Valued MRAM Based on MTJ/RTD Structure" Uemura et al., Proceedings of the 33rd International Symposium on Multiple-Valued Logic, 2003, pp. 1-6.

(Continued)

*Primary Examiner*—Tuan T. Nguyen
(74) *Attorney, Agent, or Firm*—Hayes Soloway P.C.

(57) ABSTRACT

A TMR network 120 using TMR elements as magnetoresistive elements is formed as a variable resistive element network by a series-parallel connection of two kinds of variable resistive elements R with resistance values that change according to an external input X or a memory input Y, as shown in an AND operation network 122 in FIG. 5(*b*), wherein the total resistance value $R_{total}$ is minimized, that is, the current I is maximized for a particular combination of the inputs. Assuming $R_{xi}$ and $R_{yi}$ (i=0, 1 and 2) as the resistance values of the variable resistive elements R according, respectively, to the external input X and memory input Y, the values of x and y determine the current I that flows through the network as shown in FIG. 5(*d*). Setting a threshold value between $I_0$ and $I_1$ using a threshold detector 160 makes it possible to realize AND operation. The operation result is then output as a voltage value through an IV converter 170.

7 Claims, 17 Drawing Sheets

OTHER PUBLICATIONS

"Ferroelectric-Based Functional Pass-Gate for Fine-Grain Pipe lined VLSI Computation", Hanyu et al., IEEE Int. Solid-State Circuits Conference, Feb. 2002, pp. 208-290, 460.

"Complementary Ferroelectric-Capacitor Logic for Low-Power Logic-in-Memory VLSI", Kimura et al., IEEE Int. Solid-State Circuits Conference, Feb. 2003, pp. 160, 485.

"High-Performance MRAM Technology wiht an Improved Magnetic Tunnel Junction Material", Motoyoshi et al., IEEE Symp. on VLSI Technology Dig. Tech, 2002, pp. 212-213.

"Logic-in-Memory VLSI Using Non-Volatile Devices", Kimura et al., Technical Report of IEICE ICD, pp. 1-5.

"Emerging Memories—Technologies and Trends", Kluwer Academic Publishers, 2002, pp. 69-72.

* cited by examiner

Fig. 2(a) Cross-sectional view
PRIOR ART
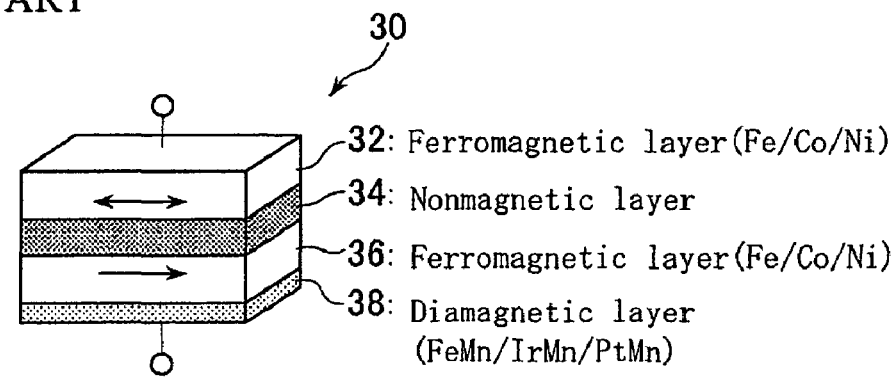
Fig. 2(b) Symbol
PRIOR ART
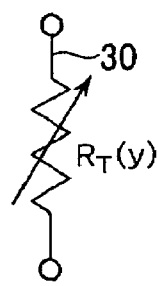
Fig. 2(c) Hysteresis characteristics
PRIOR ART
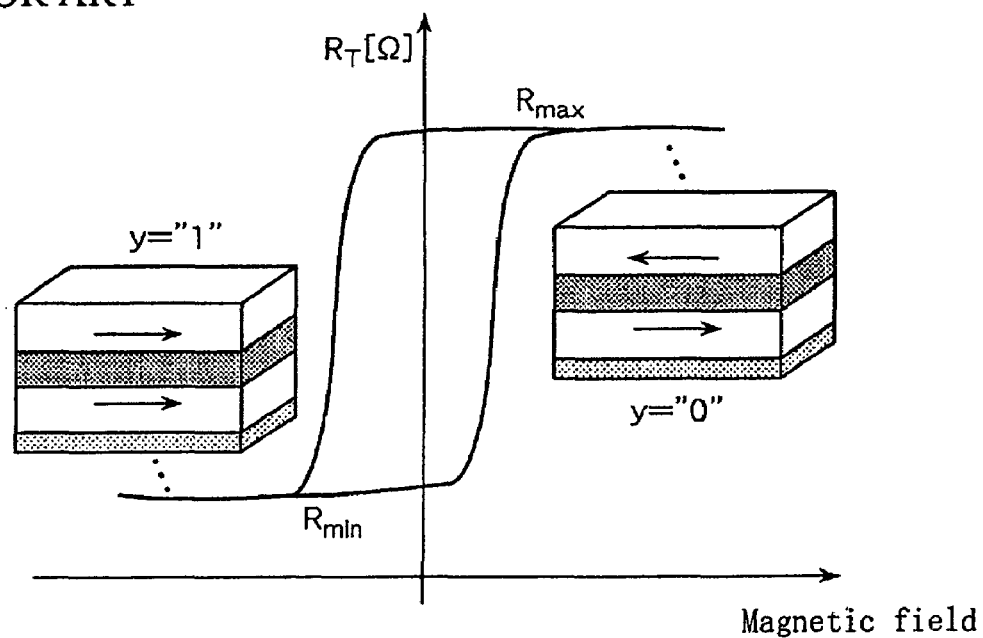

Write operation

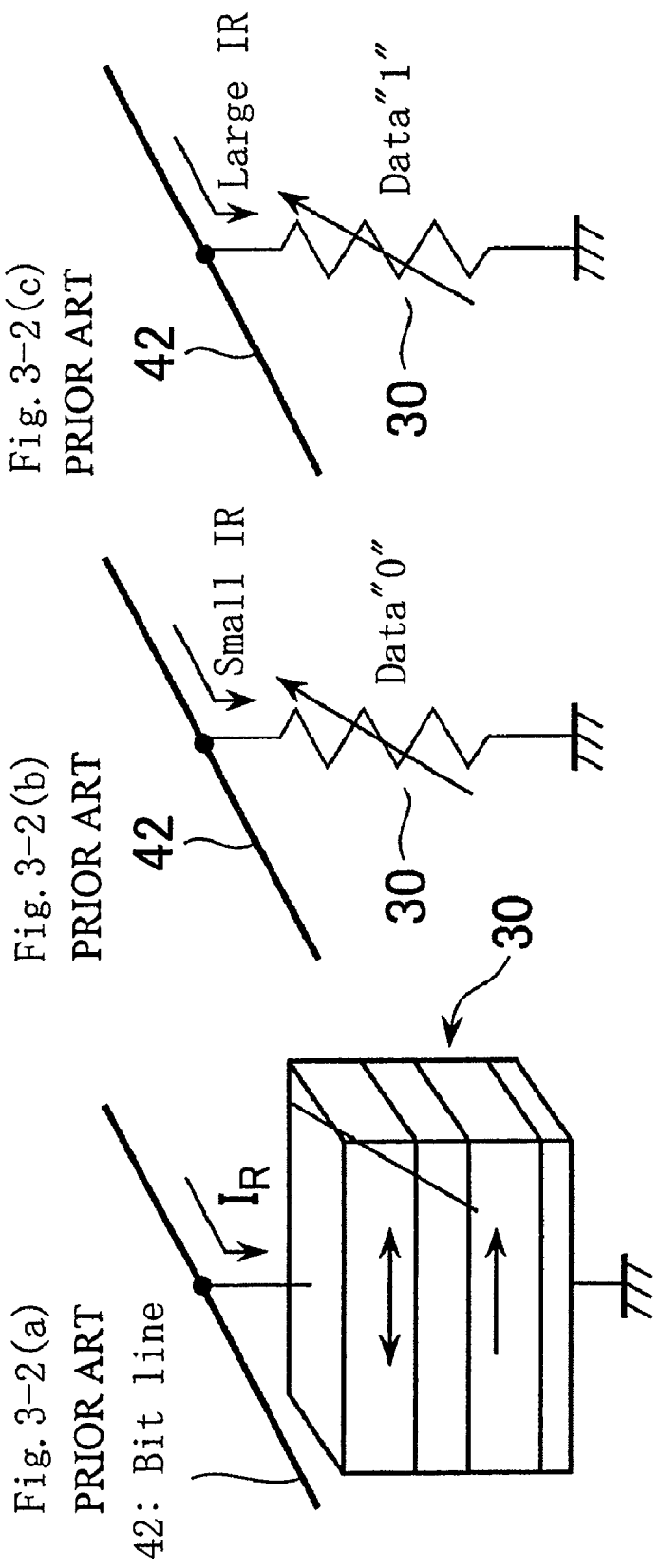

$$Z = A \cdot C \cdot B + A \cdot C \cdot \bar{B} + \bar{A} \cdot C \cdot B + A \cdot \bar{C} \cdot B$$

( ▢ : External input = Transistor )

( ▨ : Memory input = TMR element )

$$Z = A \cdot C + B \cdot (A + C)$$

Fig. 6-3(a)
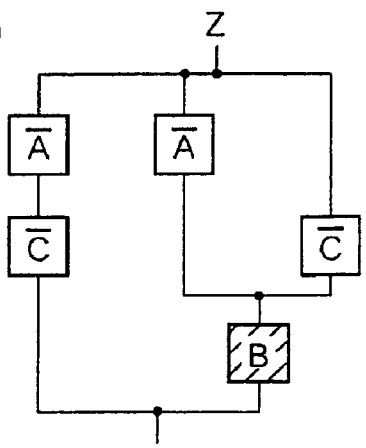
Fig. 6-3(b)
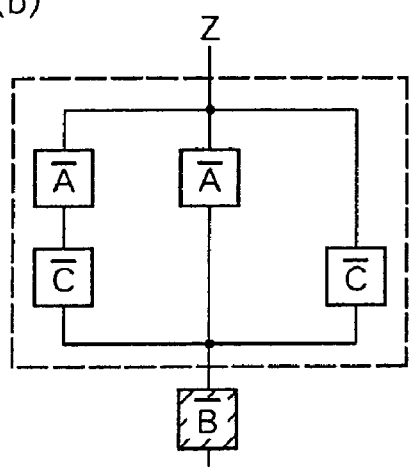
Fig. 6-3(c)
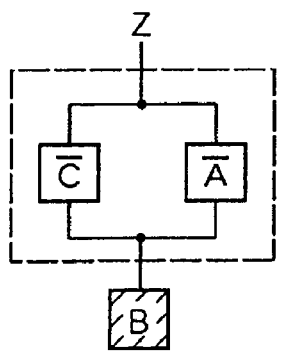

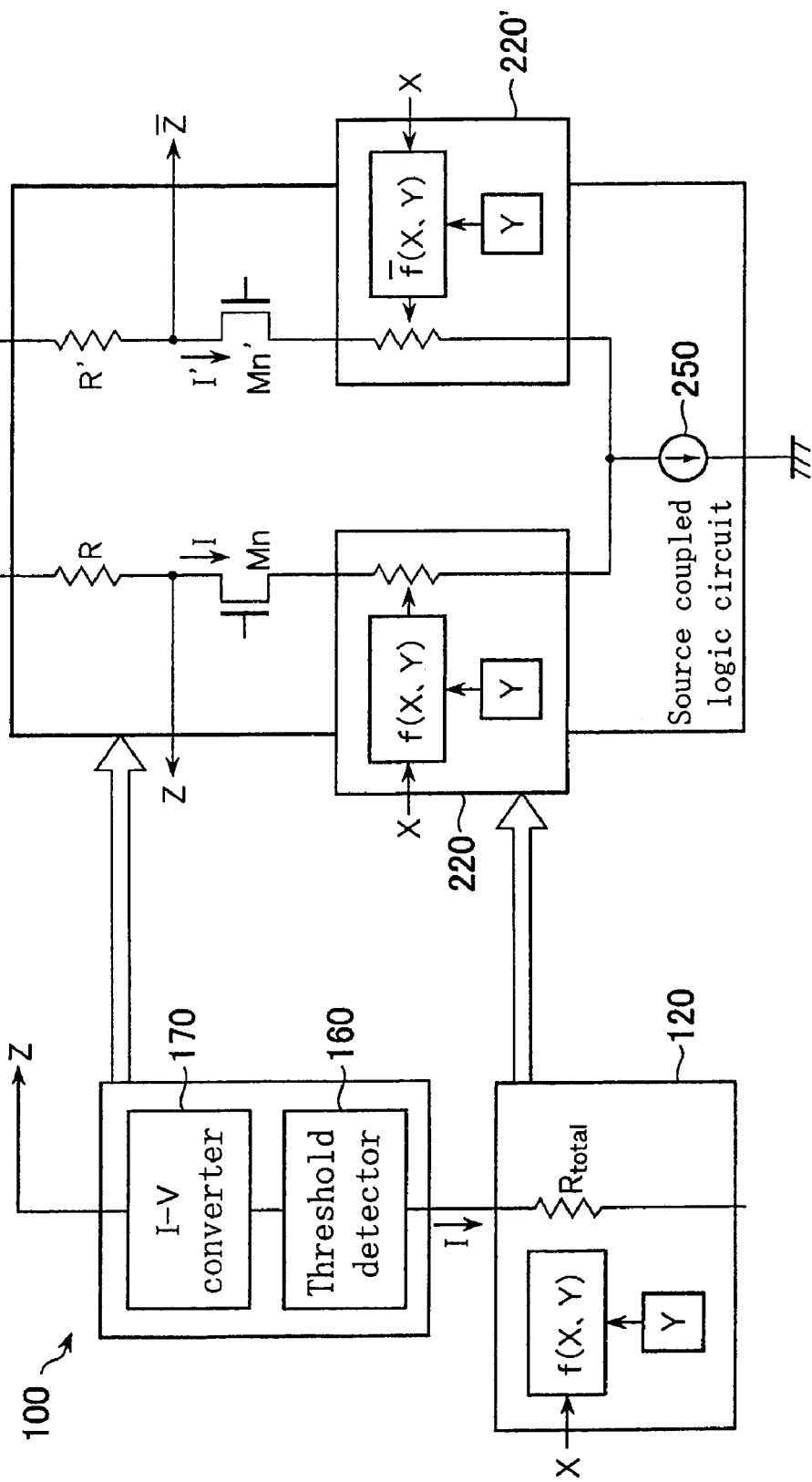

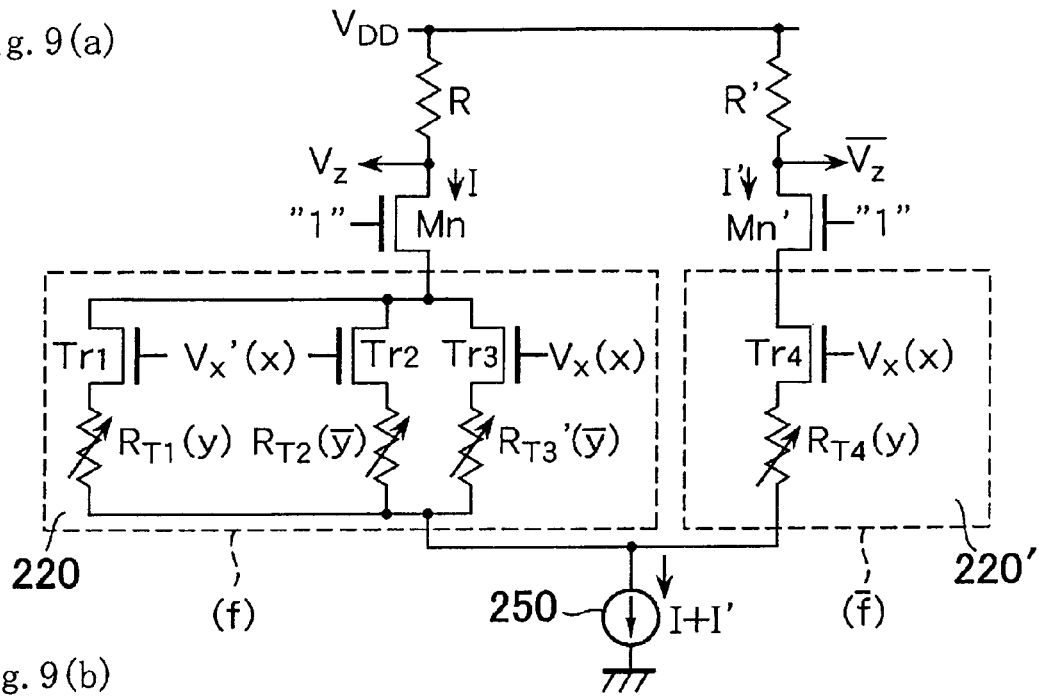

{ A, C: External input
  B: Memory input
  [⎯]: TMR element }

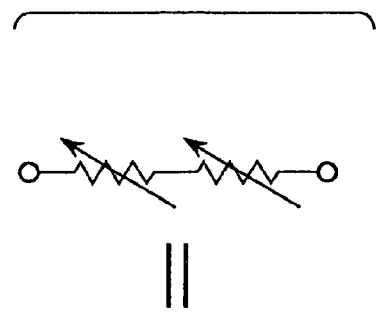
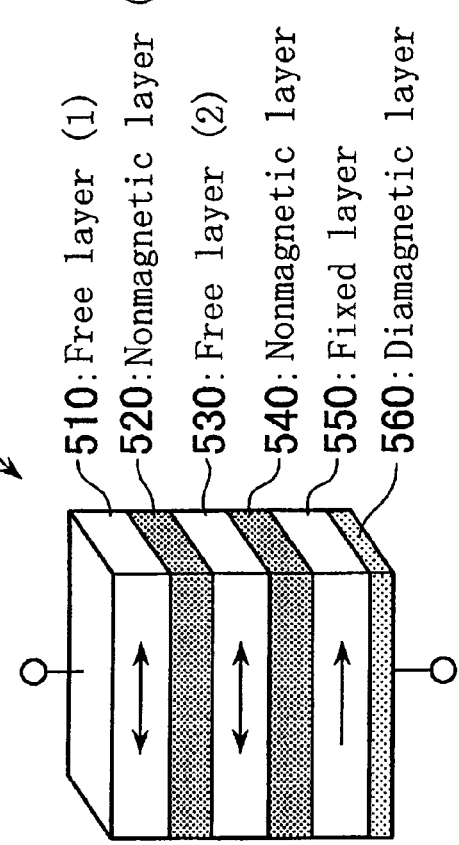
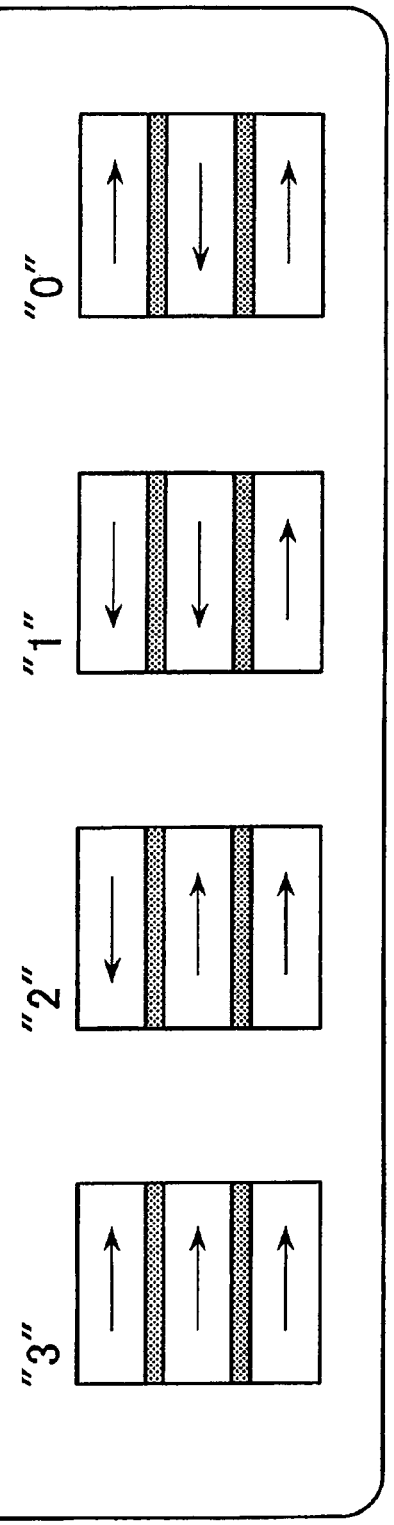

Fig. 14(a)  CRAM
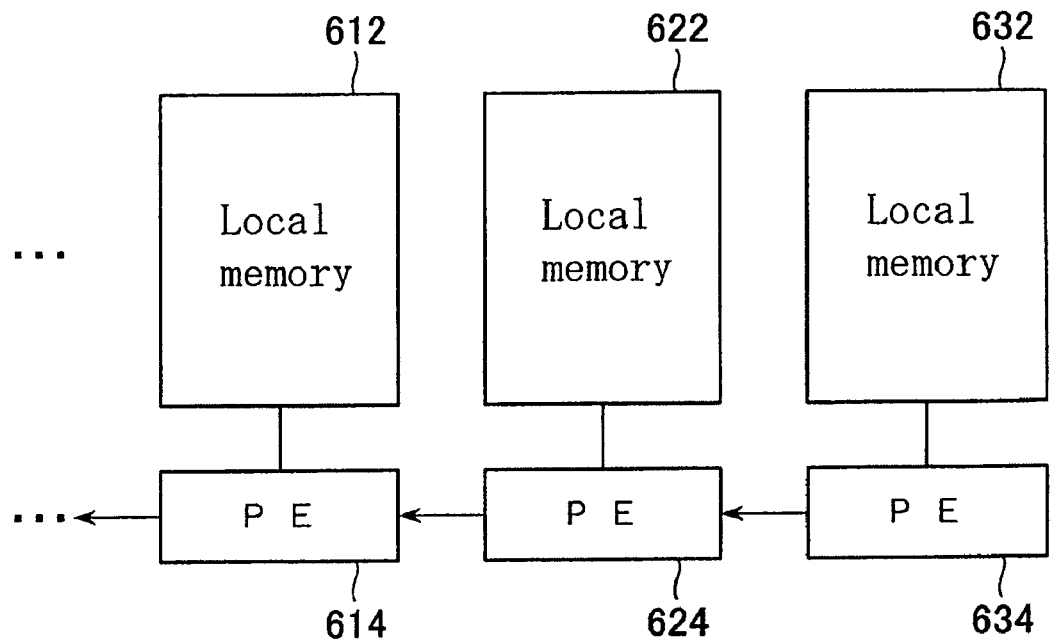
Fig. 14(b)  CRAM based on TMR source coupled logic
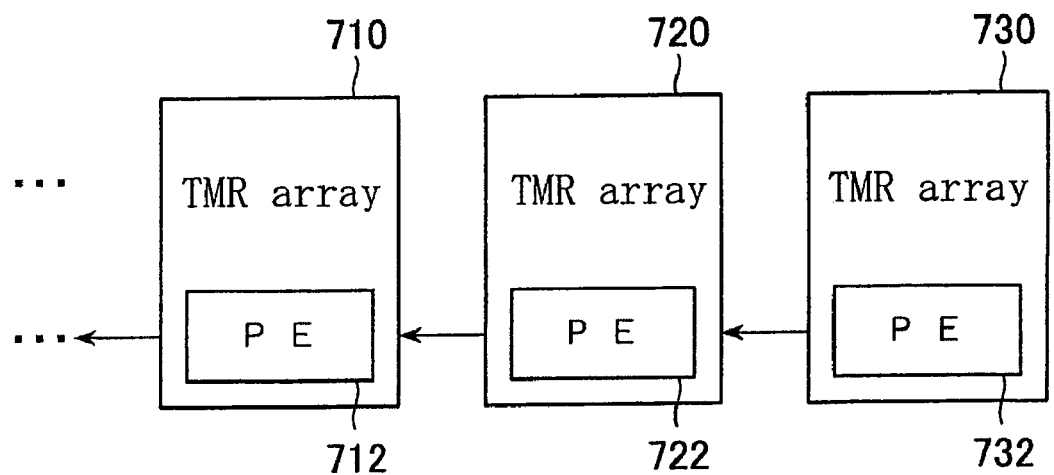

LOGIC-IN-MEMORY CIRCUIT USING MAGNETORESISTIVE ELEMENT

BACKGROUND OF THE INVENTION

1. Field of the Invention

The present invention relates to a logic-in-memory circuit using magnetoresistive element, i.e., variable resistive element capable of storing information.

2. Description of the Related Art

In integrated circuits where the performance improvement of processor elements, memories, etc. is promoted with the backdrop of rapid development in fine processing technology in recent years, performance degradation due to wiring delay and increasing wiring area is becoming a serious problem. From the point of view that many of these wiring related problems arise from conventional architectures in which circuits are formed with operation functions and memory functions being separated from each other, the inventors have focused on the logic-in-memory architecture, in which systems are formed with the integration of processor elements and memories, as a method for solving the wiring related problems fundamentally, and have proposed high-performance logic-in-memory circuit technologies in which operation functions and memory functions are compactly integrated utilizing ferroelectric devices used as memory elements in ferroelectric memory (FeRAM) (refer to Non-patent documents 1 and 2).

(Logic-in-memory Circuit)

In FIGS. 1(a) and 1(b) shown is a common VLSI 10 consisting of logic circuits and memory circuits (refer to FIG. 1(a)) and a logic-in-memory VLSI 20 (refer to FIG. 1(b)).

The processing in the common VLSI 10 is carried out by reading data out of the memory circuits 11 and 12 through a bus 15, performing operations in the logic circuits 17 and 18, and writing the operation results into the memory circuits 11 and 12 through the bus 15.

In the logic-in-memory VLSI 20 wherein nonvolatile devices are used as shown in FIG. 1(b), bottleneck in data transfer on a global wiring (bus 15) can be reduced significantly by distributing memory functions among operation circuits 22 and localizing the data transfer between a processor element 24 and a memory 25. Also, the use of nonvolatile devices makes it possible to hold stored data without power supply voltage, which allows leakage current of memory elements to be reduced significantly, having potential for substantial reduction in power consumption.

The logic-in-memory technique, which enables the amount of wiring to be reduced significantly by localizing the data transfer between processor element and memory, is useful in establishing highly parallel operation systems that have no bottleneck in data transfer, and therefore it is actually possible to realize gate-level pipeline multipliers and complete parallel associative memories compactly.

These logic-in-memory circuit technologies use nonvolatile memory devices to form operation circuits, whereby the application range thereof depends highly on the characteristics of the devices. Therefore, to expand the application range of the logic-in-memory architecture, it is important to utilize the excellent characteristics of various nonvolatile memory devices as well as ferroelectric capacitors in the logic-in-memory circuit.

(TMR Element)

It is possible to utilize magnetoresistive elements, particularly, ferromagnetic tunnel magnetoresistive (TMR) elements used mainly as memory elements in ferromagnetic memory (MRAM) as a new elemental technology in logic-in-memory circuit (refer to Non-patent document 3). TMR elements, which are also called ferromagnetic tunnel junction elements (MTJ elements), can perform electrical data access to magnetic memory elements by utilizing the spin-tunnel magnetoresistive effect that changes the electrical resistance in accordance with the spin (magnetization) direction in a ferromagnetic material, which makes it possible to realize excellent memory functions of magnetic storage in integrated circuits, such as non-volatility, nondestructive read-out, high-speed access, and infinite rewritability.

The structures and operations of TMR element are shown in FIGS. 2(a), 2(b), 2(c), 3-1(a), 3-1(b) and 3-1(c). As shown in the cross sectional view of FIG. 2(a), a TMR element 30 comprises a ferromagnetic layer (free layer) 32 where the spin (magnetization) direction changes in accordance with an externally applied magnetic field, an ultrathin nonmagnetic layer 34 and another ferromagnetic layer (fixed layer) 36 having a constant spin direction independent of externally applied magnetic field, having a three-layer structure of the ferromagnetic, nonmagnetic and ferromagnetic layers. To the fixed layer 36 is applied a diamagnetic layer 38 to fix the spin direction in the ferromagnetic layer 36. FIG. 2(b) is a symbolic representation of the TMR element 30. A major characteristic of TMR element is that the electrical resistance of the element 30 increases or decreases rapidly as the spin direction in the free layer 32 is changed by an external magnetic field as shown in the hysteresis characteristics of FIG. 2(c). For example, when the spin directions in the free layer 32 and the fixed layer 36 are reversely parallel with each other, the tunnel current in the nonmagnetic layer 34 decreases, resulting in a high resistance. On the contrary, when the spin directions in the free layer 32 and the fixed layer 36 are parallel with each other, the tunnel current in the nonmagnetic layer 34 increases, resulting in a low resistance. Therefore, under a rule that the stored data is represented by "1" in the case of a parallel spin direction, while by "0" in the case of a reversely parallel one, the TMR element 30 can be considered as a nonvolatile memory element that holds stored data as resistance value.

Write operation into the TMR element 30 is performed by applying a current to a wiring adjacent to the TMR element and generating a magnetic field around the wiring. Write operations are shown in FIGS. 3-1(a), 3-1(b) and 3-1(c). As shown in FIG. 3-1(a), currents $I_B$ and $I_W$ are applied, respectively, to two adjacent wirings that run at right angles to one another (a bit line 42 and a write line 44) to perform a write operation by a synthetic magnetic field $H_B+H_W$. FIGS. 3-1(b) and 3-1(c) show that data "0" or "1" is written in accordance with the direction of the current $I_B$. As described, data can be written selectively into a cell on a memory array according to whether or not there flows the current $I_W$ through the write line 44, and therefore this kind of write operation is widely used for MRAM.

Stored data read operations from the TMR element 30 are shown in FIGS. 3-2(a), 3-2(b) and 3-2(c). Stored data read operation is performed, as shown in FIG. 3-2(a), by applying a voltage from the bit line 42 to the TMR element 30 and detecting a current $I_R$ that flows according to the resistance value of the TMR element 30 (refer to FIGS. 3-2(b) and 3-2(c)). In this case, where the current $I_R$ on the bit line 42 is sufficiently smaller than the current $I_B$ in the write operation, no stored data is destroyed. That is, nondestructive read operation can be performed.

When realizing a memory element using a TMR element in an actual circuit, the increase of the magnetoresistance (MR) ratio (($R_{max}-R_{min}$)/$R_{min}$) defined by the maximum resistance $R_{max}$ and the minimum resistance $R_{min}$ in FIG. 2(c) is important for performance improvement. Currently, there are proposed TMR elements with large MR ratios of 45 to 55% (refer to Non-patent document 3).

TMR element allows electrical data access to magnetic memory elements to be electrically performed by utilizing the spin-tunnel magnetoresistive effect that changes the resistance value in accordance with the spin (magnetization) direction in a ferromagnetic material, which makes it possible to realize excellent memory functions of magnetic storage in integrated circuits, such as non-volatility, nondestructive read-out, high-speed access, and infinite rewritability.

It is noted that there is introduced a logic-in-memory circuit using TMR elements in Non-patent document 4.

A giant magnetoresistive element (GMR element) can be cited, for example, as another type of magnetoresistive element other than TMR element. A significant difference between GMR element and above-mentioned TMR element is the physical mechanism for the magnetic change of resistance values. In the case of TMR element, when applying a voltage perpendicularly to a nonmagnetic layer (tunnel layer, which includes $AlO_2$ mainly), the resistance value is changed by the tunnel magnetoresistive effect in which tunnel current changes according to whether the magnetization directions in two ferromagnetic layers are parallel or reversely parallel to each other. Meanwhile in the case of GMR element, when applying a voltage parallel to a nonmagnetic layer (which includes Cu mainly), the degree of electron scattering in the nonmagnetic layer is changed according to whether the magnetization directions in two ferromagnetic layers are parallel or reversely parallel to each other, resulting in a change of the resistance value (refer to Non-patent document 5).

The basic operations for GMR element are similar to those for TMR element, that is, read operation is performed by detecting the resistance value, while write operation is performed by applying an external magnetic field and changing the magnetization direction in ferromagnetic layers.

[Non-patent document 1] T. Hanyu, H. Kimura, M. Kameyama, Y. Fujimori, T. Nakamura and H. Takasu, "Ferroelectric-Based Functional Pass-Gate for Fine-Grain Pipelined VLSI Computation," in IEEE Int. Solid-State Circuits Conf. (ISSCC)

[Non-patent document 2] H. Kimura, T. Hanyu, M. Kameyama, Y. Fujimori, T. Nakamura and H. Takasu, "Complementary Ferroelectric-Capacitor Logic for Low-Power Logic-in-Memory VLSI," in IEEE Int. Solid-State Circuits Conf. (ISSCC) Dig. Tech. Papers, pp. 160–161, February 2003.

[Non-patent document 3] M. Motoyoshi, K. Moriyama, H. Mori, C. Fukumoto, H. Itoh, H. Kano, K. Bessho and H. Narisawa, "High-performance MRAM Technology with an Improved Magnetic Tunnel Junction Material," in IEEE Symp. on VLSI Technology Dig. Tech, Papers, pp. 212–213, June 2002.

[Non-patent document 4] H. Kimura, T. Hanyu and M. Kameyama, "Logic-in-Memory VLSI Configuration Using Nonvolatile Device," TECHNICAL REPORT OF IEICE ICD 2003-5 (2003-04).

[Non-patent document 5] Betty Prince, "Emerging Memories-Technologies and Trends," Kluwer Academic Publishers, 2002

SUMMARY OF THE INVENTION

Accordingly, an object of the present invention is to provide a logic-in-memory circuit using magnetoresistive element.

To achieve the above-mentioned object, the present invention provides a logic-in-memory circuit, comprising a magnetoresistive effect network formed by a series-parallel connection of magnetoresistive elements with resistance values that change according to stored values and transistors with resistance values that change according to externally input values, the resistance value of the network being minimized for a particular combination of stored values and externally input values, and a threshold detection circuit for detecting the threshold value of current that flows through the magnetoresistive effect network, wherein the particular combination of stored values and externally input values is detected by the threshold detection circuit.

The magnetoresistive effect network uses the fact that the resistance change of magnetoresistive elements is smaller than that of transistors to realize the particular combination of stored values and externally input values that minimizes the resistance value of the network with less number of magnetoresistive elements and transistors.

It is desirable for the magnetoresistive effect network to have two complementary outputs, a differential pair circuit being formed using the two outputs as current paths, and to perform the threshold value detection by comparing currents flowing through each of the current paths with each other using the differential pair circuit.

The differential pair circuit can also be a dynamic type one including two phases, one being a precharge phase where the differential pair circuit is driven by a clock signal to charge capacitors connected to the current paths, and the other being an evaluation phase where currents flowing through the magnetoresistive effect network are compared with each other using the stored charges to charge another capacitor.

The magnetoresistive elements that form the magnetoresistive effect network can also be TMR elements.

The magnetoresistive elements that form the magnetoresistive effect network can be multi-valued TMR elements. In this case, it is desirable to form the magnetoresistive effect network by dividing multi-valued inputs by their weight, to form differential pair circuits for each magnetoresistive effect network in combination with inputs having weights of zero, and to output the outputs of each differential pair circuit being added to each other.

Focusing on the fact that magnetoresistive elements can be considered as variable resistive elements with resistance values that change according to stored data, a magnetoresistive effect network, the resistance value of which is minimized only for a particular combination of external data and stored data, is formed in combination with transistors controlled by externally input data, and is adapted to detect and output the particular combination, whereby the magnetoresistive elements operate not only as memory elements but also as processor elements in the magnetoresistive effect network, and therefore excellent memory functions of the magnetoresistive elements can be integrated compactly in an operation circuit.

BRIEF DESCRIPTION OF THE DRAWINGS

FIG. 1(a) is a view showing a common VLSI comprised of logic circuits and memory circuits, while

FIGS. 2(a), 2(b) and 2(c) are views showing the structures and characteristics of TMR element;

FIGS. 3-1(a), 3-1(b) and 3-1(c) are views showing write operations into TMR element;

FIGS. 3-2(a), 3-2(b) and 3-2(c) are views showing read operations from TMR element;

FIGS. 6-1(a) and 6-1(b) are views showing the configuration of TMR network;

FIGS. 6-2(a) and 6-2(b) are views showing the simplification of a TMR network;

Figure 8:
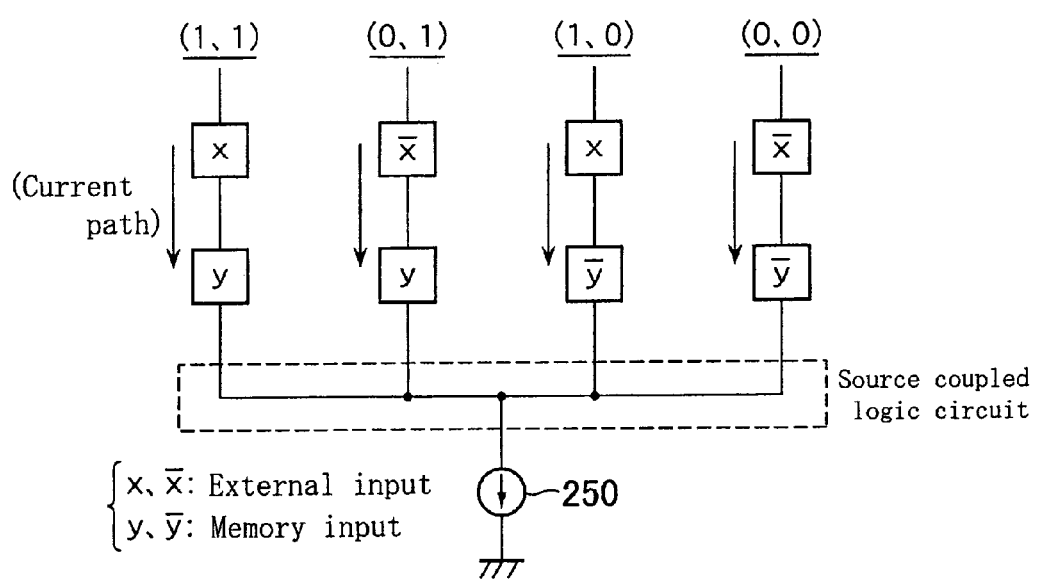
Figure 10A:
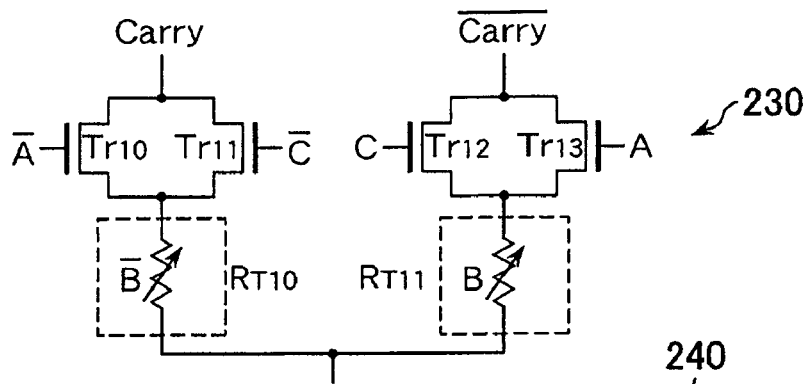
Figure 10B:
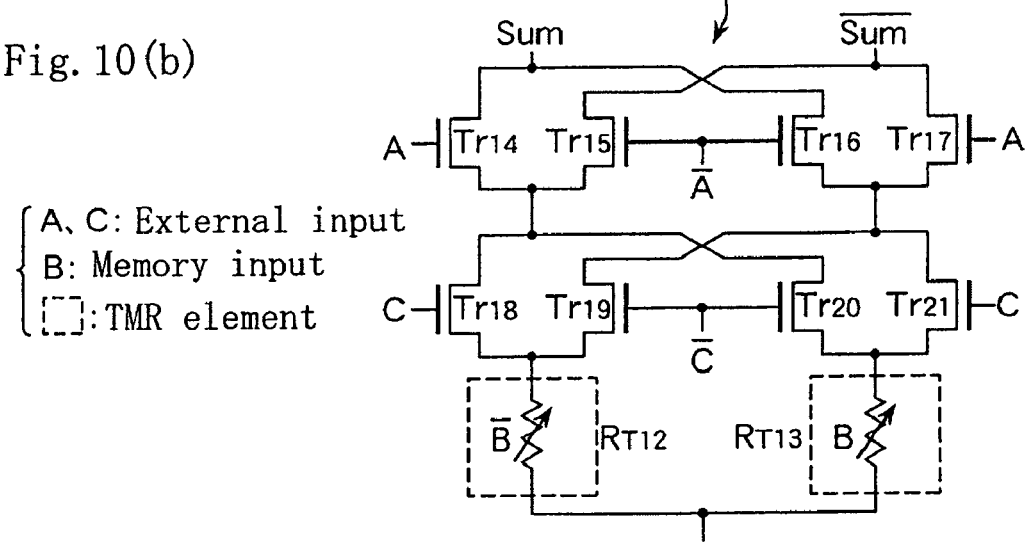
Figure 10C:
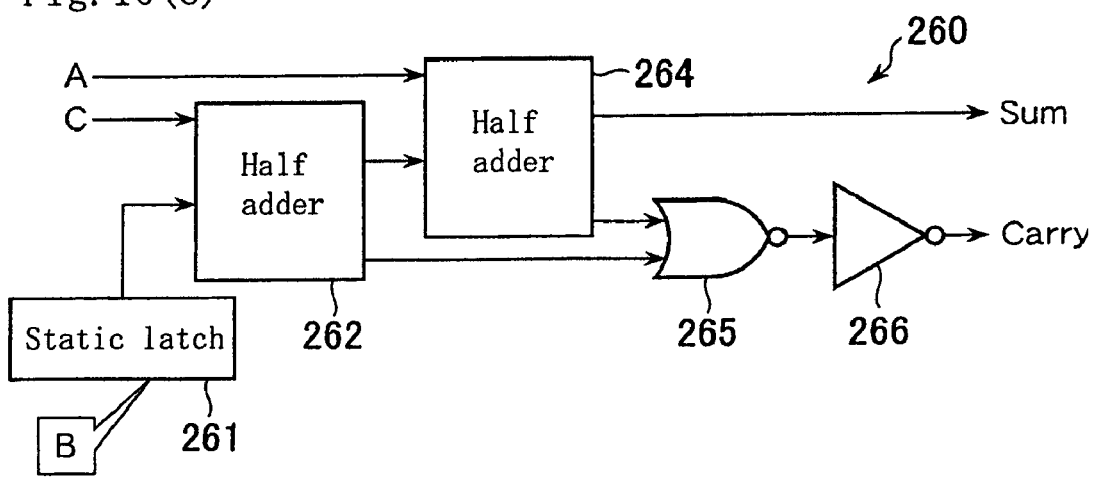
Figure 11:
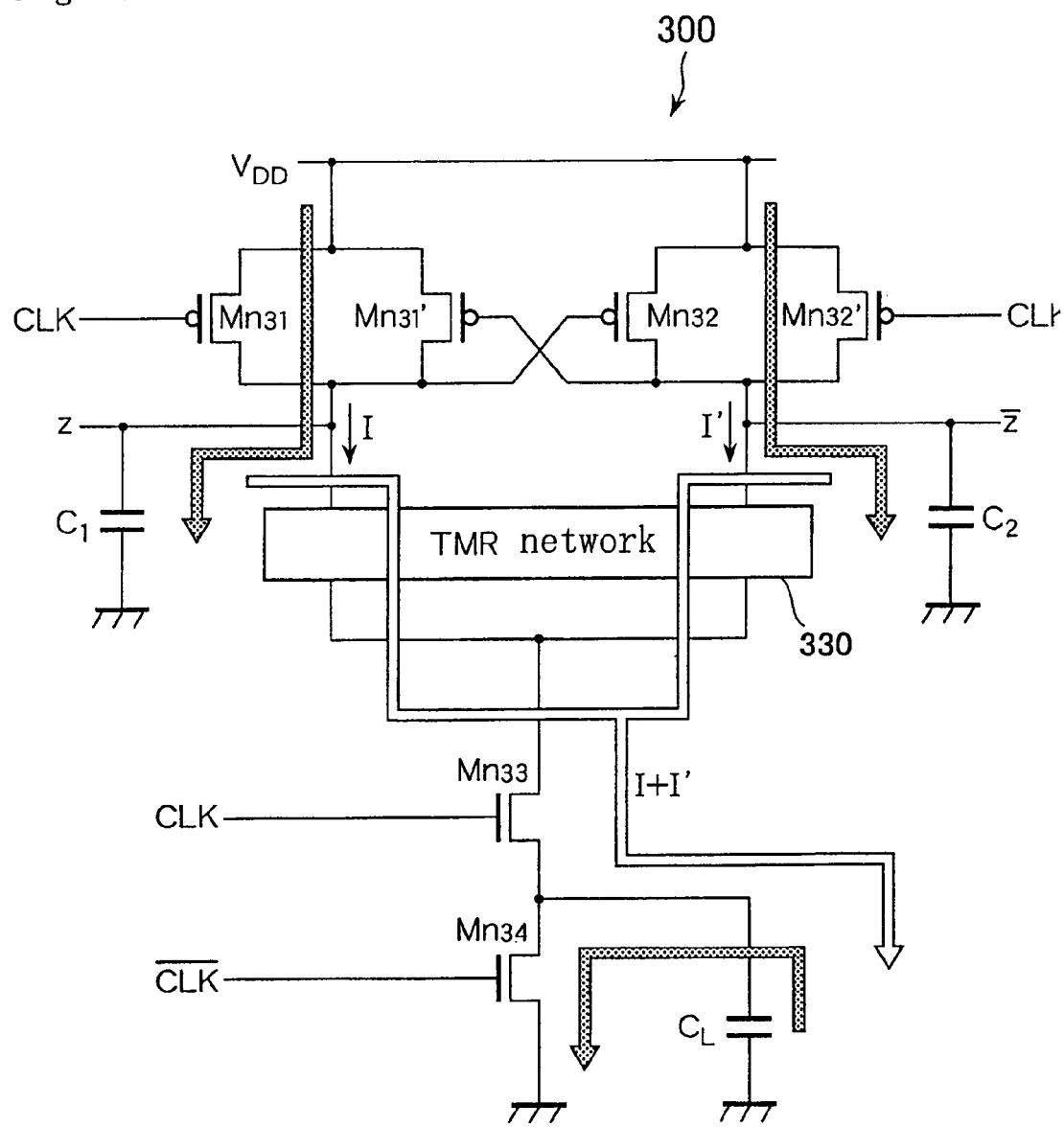
Figure 12:
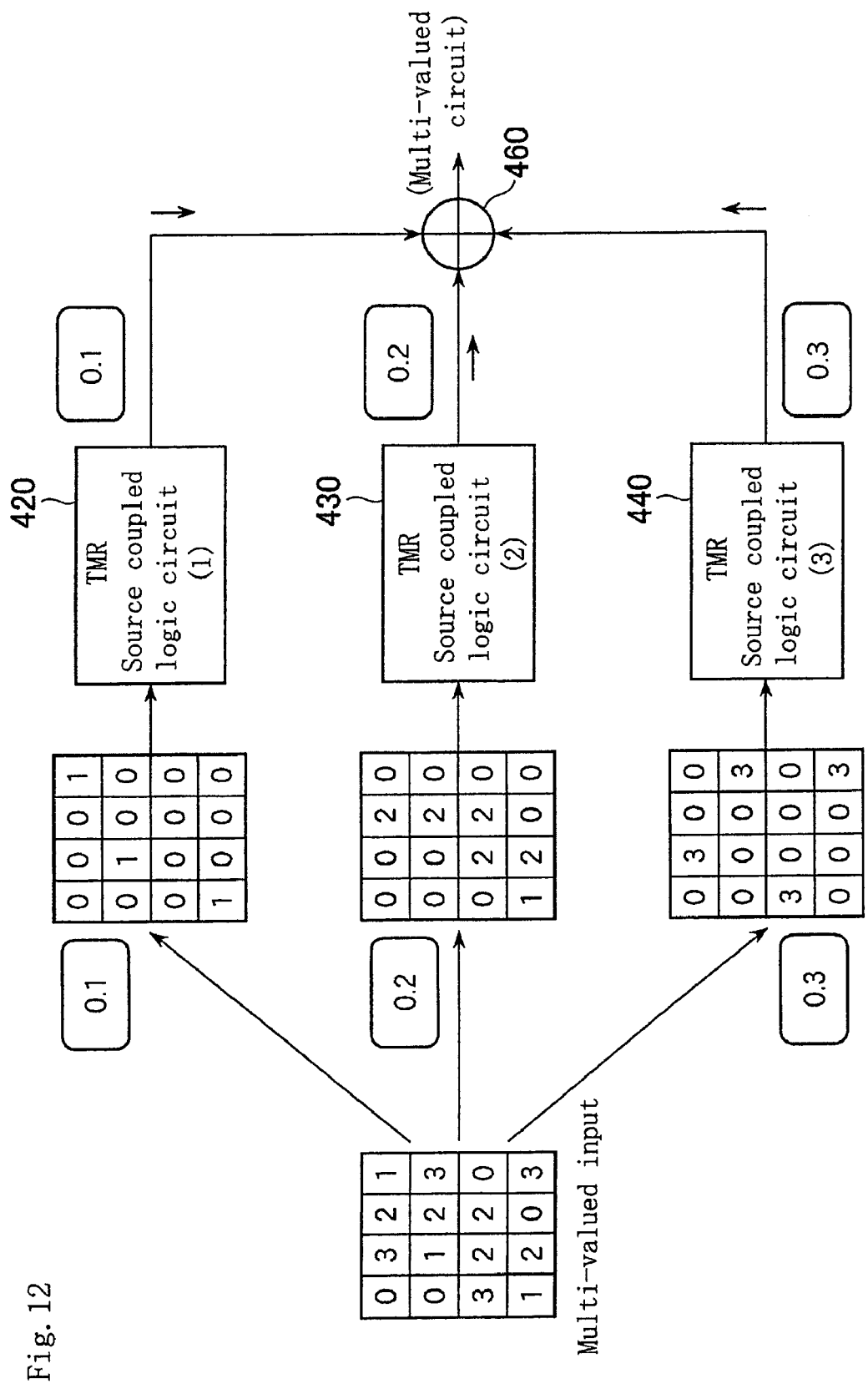

showing further simplification of the TMR network;

FIGS. 7(a) and 7(b) are views showing the configuration of a source coupled logic circuit;

FIG. 8 is a view showing the configuration of a complementary TMR network;

FIGS. 9(a) and 9(b) are views showing an example of the configuration of an AND operation source coupled logic circuit;

FIGS. 10(a), 10(b) and 10(c) are views showing an example of the configuration of a full-additional TMR network used for source coupled logic circuit, while FIG. 10(c) is a block diagram of a conventional full adder;

FIG. 11 is a view showing an example of the configuration of a dynamic type source coupled logic circuit;

FIG. 12 is a view showing an example of the configuration of a multi-valued TMR network;

FIGS. 13(a), 13(b) and 13(c) are views showing an example of the configuration of a four-valued TMR element; and FIGS. 14(a) and 14(b) are views showing examples of the configuration of CRAM as applications.

DESCRIPTION OF THE PREFERRED EMBODIMENTS

Preferred embodiments of the present invention will hereinafter be described referring to the accompanying drawings.

Figure 4:
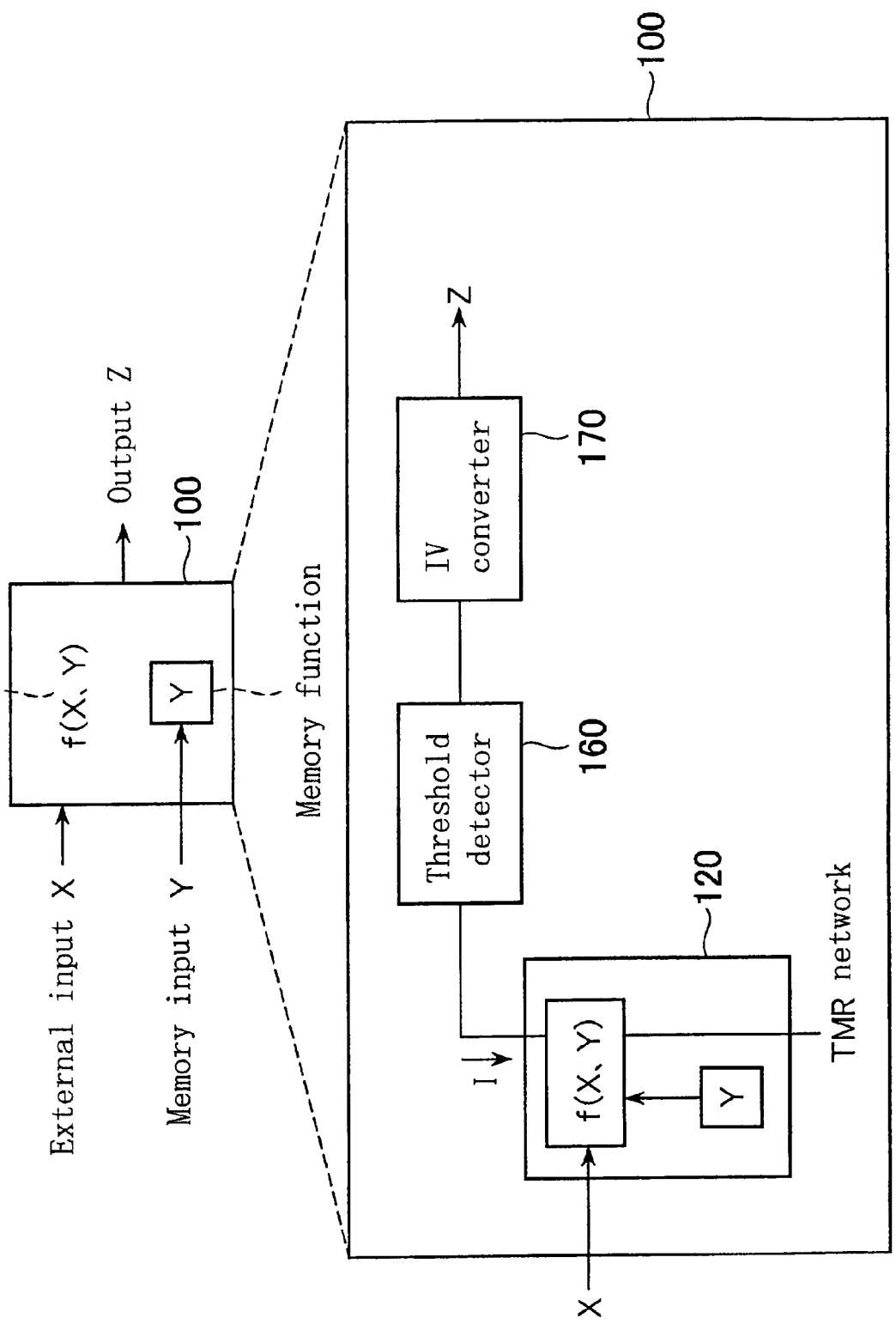
FIG. 4 is a view showing the input and output configuration of a TMR network.

FIG. 4 is a view showing the overall configuration of a logic-in-memory circuit using TMR elements as magnetoresistive elements, i.e., variable resistive elements.

The logic-in-memory circuit 100 shown in FIG. 4 has binary inputs, i.e., an external input X and a memory input Y, and comprises an operation function for performing an operation f (X, Y) using the inputs X and Y and a memory function for storing the memory input Y. The operation result is obtained as a binary output Z. This kind of logic-in-memory circuit 100 consists of a TMR network 120 that includes TMR elements having operation functions and memory functions, a threshold detector 160 and an IV converter 170.

Figure 5:
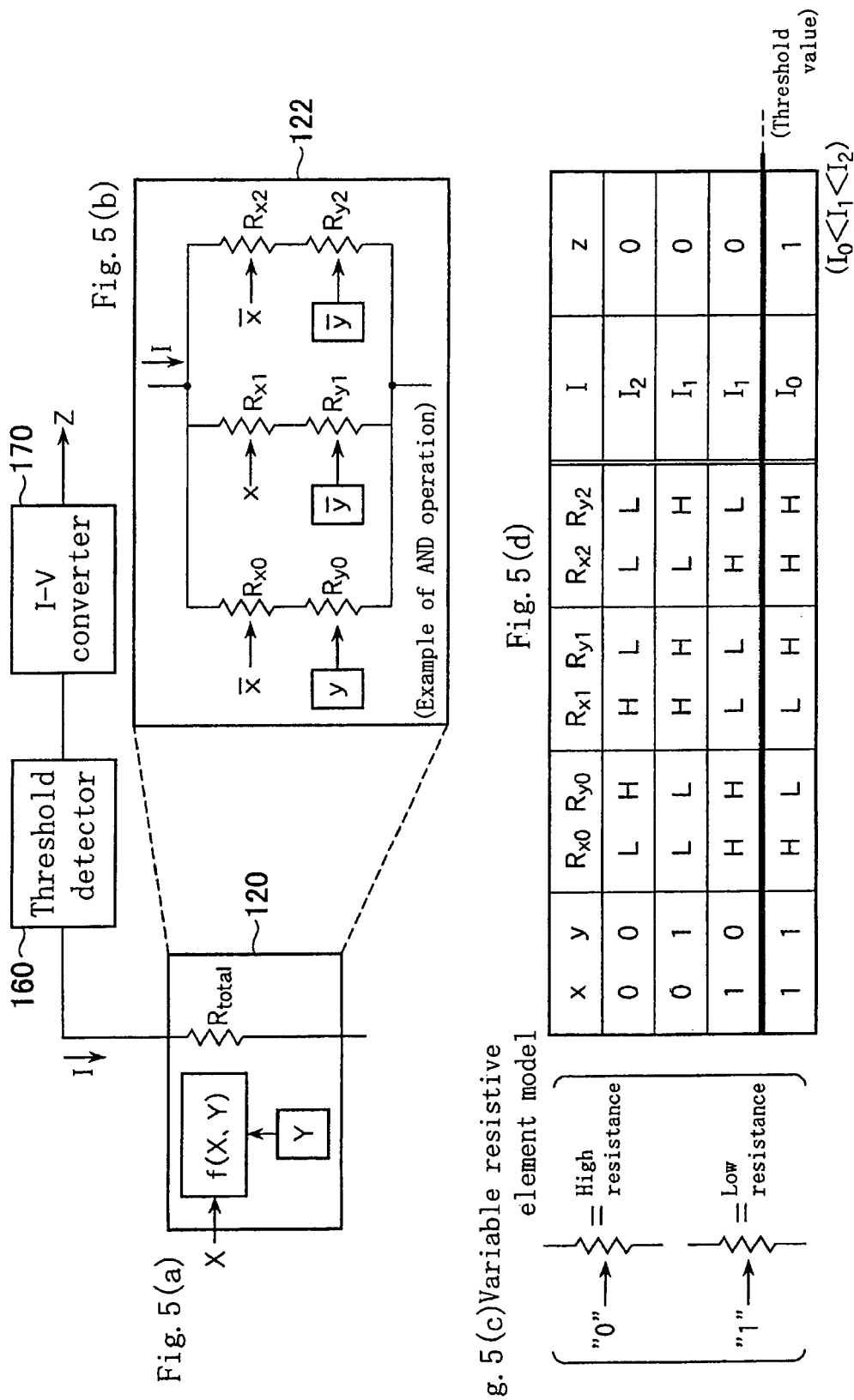
FIGS. 5(a), 5(b), 5(c) and 5(d) are views illustrating the operations of the TMR network.

As shown, for example, in an AND operation network 122 in FIG. 5(b), the TMR network 120 is formed as a variable resistive element network by a series-parallel connection of two kinds of variable resistive elements R with resistance values that change according to the external input X or memory input Y, wherein if f(X, Y)=1, the total resistance value $R_{total}$ is minimized, that is, the current I is maximized. Here, the variable resistive elements forming the network indicate high resistance if input data is "0", while low resistance if input data is "1", as shown in FIG. 5(c). In an actual circuit, variable resistive elements with resistance values that change according to the external input X are realized by transistors (MOS transistors), while the other variable resistive elements with resistance values that change according to the memory input Y are realized by TMR elements. For example, the AND operation circuit 122 in FIG. 5(b) is formed by a series-parallel connection of variable resistive elements R. In this case, assuming $R_{Xi}$ and $R_{Yi}$ (i=0, 1 and 2) as the resistance values of variable resistive elements R according, respectively, to the external input X and memory input Y, the values of x and y determine the current I that flows through the network as shown in FIG. 5(d), where I takes the minimum value ($I_0$) if (X, Y)=(1, 1). Here, setting a threshold value between $I_0$ and $I_1$ using the threshold detector 160 makes it possible to realize the AND operation. The operation result is then output as a voltage value through the IV converter 170.

(Simplification of TMR Network)

Figure 1A:
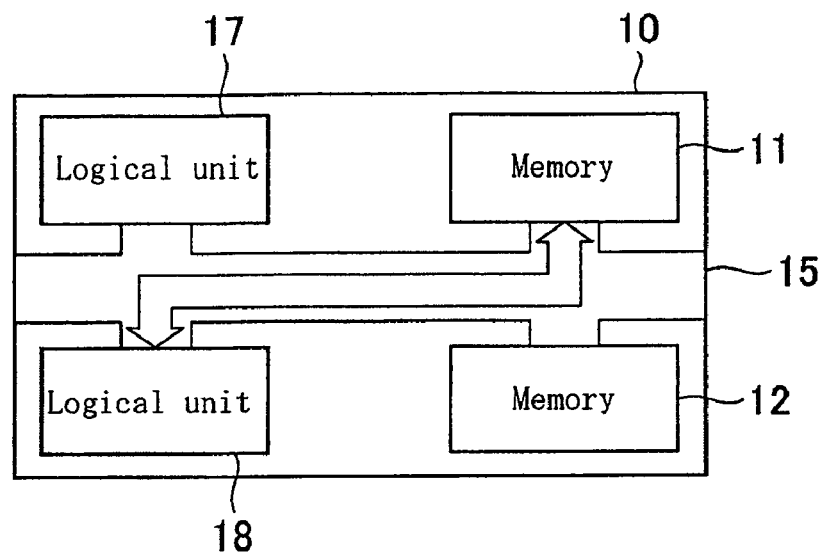
Figure 1B:
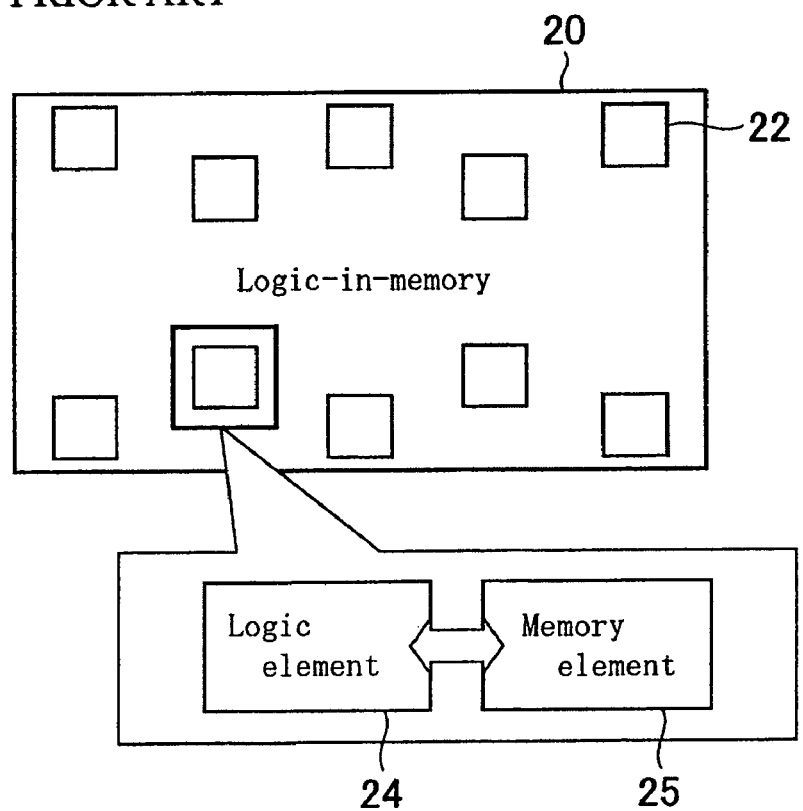
FIG. 1(b) is a view showing a logic-in-memory VLSI.
Figures 1A, 6:
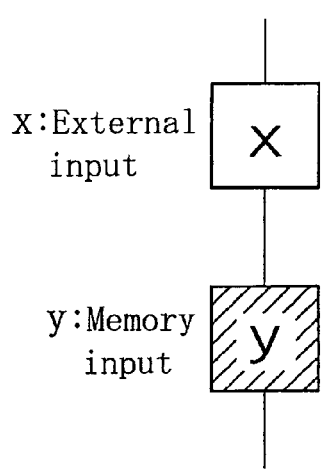
Figures 1B, 6:
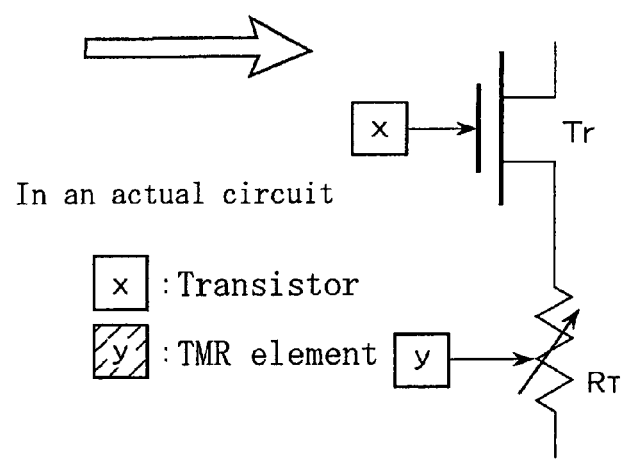

As described above, a MOS transistor $T_r$ and a TMR element $R_T$ are used being connected in series with each other in an actual circuit as shown in FIG. 6-1(b), respectively, as an external input x and a memory input y in FIG. 6-1(a). The configuration of TMR network can be simplified using the characteristics of the configuration above. This will be explained referring to FIGS. 6-2(a), 6-2(b), 6-3(a), 6-3(b) and 6-3(c).

Figures 2A, 6:
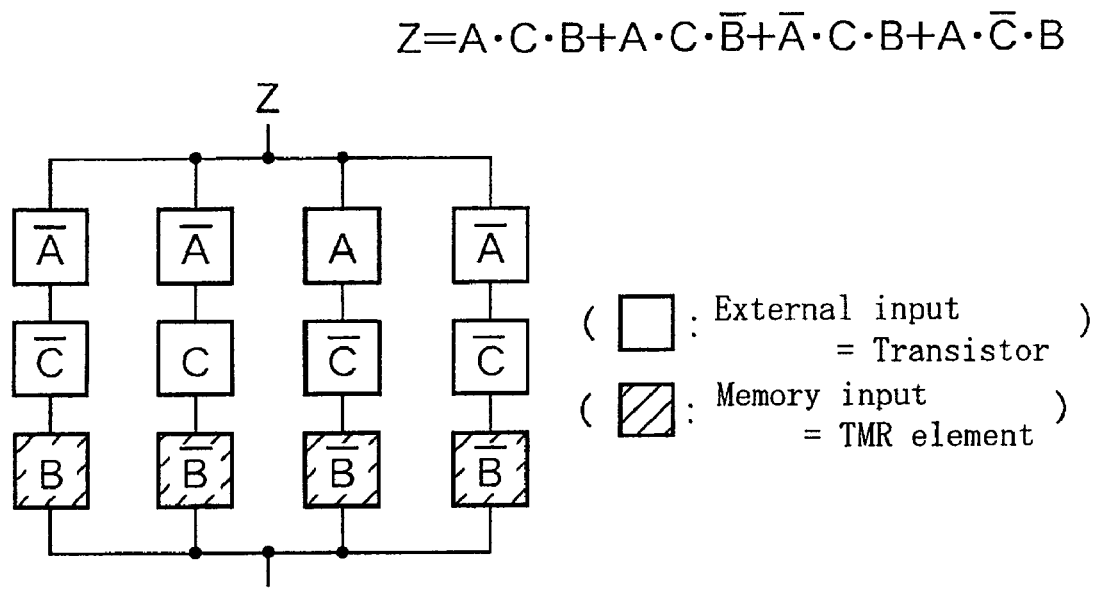

A simplification of a TMR network shown in FIG. 6-2(a) (standardized form) will be considered. It is noted that A and C correspond to external inputs, while B to memory inputs in FIGS. 6-2(a), 6-2(b), 6-3(a), 6-3(b) and 6-3(c). FIG. 6-2(a) shows a standardized TMR network of the following logical expression that calculates Carry signals in a full adder.

$$Z = A \cdot C \cdot B + A \cdot C \cdot \overline{B} + \overline{A} \cdot C \cdot B + A \cdot \overline{C} \cdot B \qquad \text{[Equation 1]}$$

Figures 2B, 6:
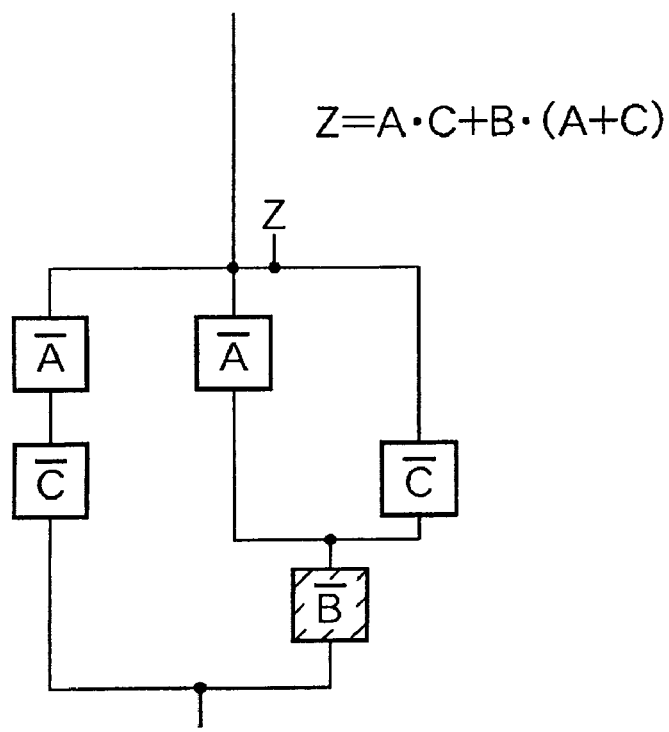

First, the network shown in FIG. 6-2(a) can be transformed into the configuration shown in FIG. 6-2(b) by a common simplification, e.g., using Carnot diagrams.

$$z = A \cdot C + B \cdot (A + C) \qquad \text{[Equation 2]}$$

Figures 1A, 3:
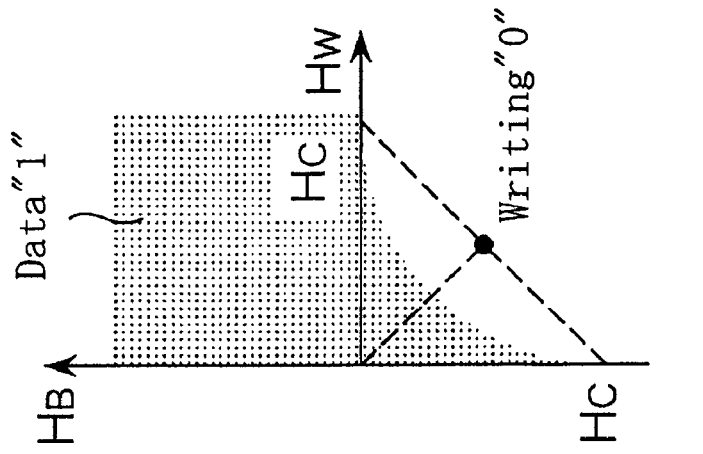
Figures 1B, 3:
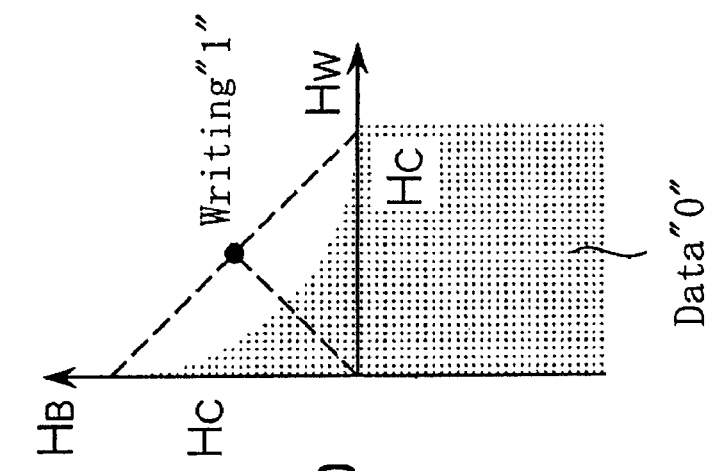
Figures 1C, 3:
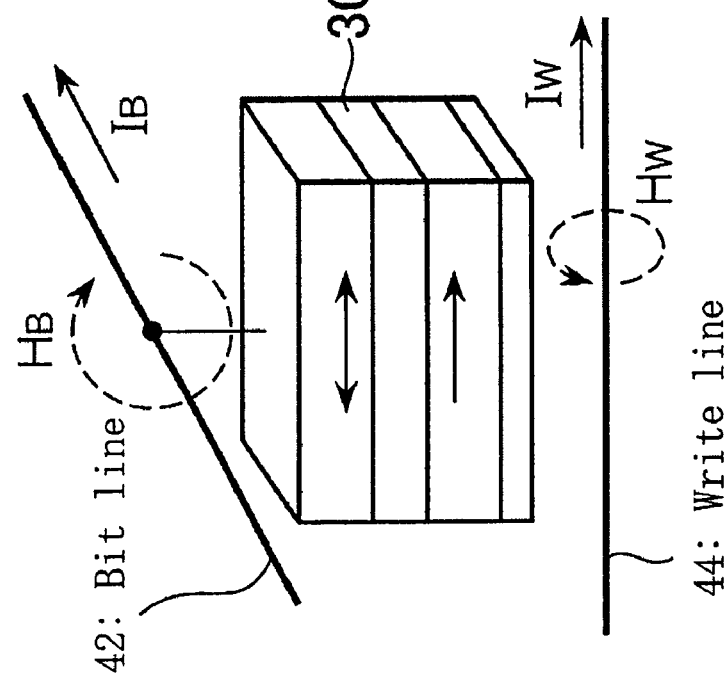

In addition, since the resistance change of TMR elements (60 kΩ to 90 kΩ) is smaller than that of transistors (20 kΩ to 1 MΩ), when a large current flows regardless of the resistance value of TMR elements depending on the switching status of transistors, current path for the large current remains unchanged even if another TMR element is added (refer to FIG. 6-3(b)). This is a specific characteristic of TMR network, and therefore circuits can be simplified with a constant logical expression utilizing the resistance difference between TMR elements and transistors. The simplification finally achieves the configuration shown in FIG. 6-3(c) (simplified form).

(Source Coupled Logic Circuit)

In the logic-in-memory circuit 100 including the variable resistive element network 120 shown in FIG. 7(a), it is important to detect minute resistance changes in the variable resistive element network 120 immediately and to realize the threshold detector 160 and IV converter 170 compactly. Thus, the inventors have focused on threshold operation function and high driving performance of the source coupled logic.

FIG. 7(b) shows a source coupled logic circuit (differential pair circuit) formed with MOS transistors Mn and Mn' using variable resistive element networks 220 and 220' that perform complementary operations, the circuit realizing the logic-in-memory circuit shown in FIG. 7(a) compactly. In the circuit shown in FIG. 7(b), threshold operation between currents I and I' is performed using the differential pair circuit formed with the MOS transistors Mn and Mn', and each current is converted into voltage through the differential pair circuit of the transistors Mn and Mn', resulting in simultaneous IV conversions. This enables a high-performance logic-in-memory circuit 200 to be realized compactly.

In the source coupled logic using TMR network (TMR source coupled logic) 200, any complementary logical operation is realized, as shown in FIG. 8, by a series-parallel connection of variable resistive elements with resistance values that change according to external inputs or memory inputs. When realizing a complementary two-variable logical operation where a logical operation f (x, y) between an external input x and a memory input y is performed, variable resistive elements depending on complementary inputs x (bar x) or y (bar y) are connected first in series and then in parallel, as shown in FIG. 8, in such a manner that a large current flows only through one of current paths according to the combinations of x and y on the current paths. Next, upper terminals are connected to z or bar z to form a complementary variable resistive element network, so that the total resistance value of the variable resistive elements $R_{total}$ is minimized, that is, the current is maximized only for a particular combination of x and y. Then, the TMR source coupled logic circuit 200 can be formed by realizing the variable resistive elements depending on external inputs and memory inputs, respectively, with MOS transistors and TMR elements.

FIGS. 9(*a*) and 9(*b*) show an example of the configuration of an AND operation by TMR source coupled logic circuit. In FIG. 9(*a*), the complementary TMR networks 220 and 220' with resistance values that change according to the following complementary AND operations are used, respectively, for the transistors Mn and Mn'.

$$f = x \cdot y, \bar{f} = \overline{x \cdot y}$$ [Equation 3]

The currents I and I' flowing through the complementary TMR networks 220 and 220' vary according to external inputs and memory inputs as shown in FIG. 9(*b*). Threshold operation between the currents I and I' is performed by a comparison in the differential pair circuit formed with the transistors Mn and Mn' to realize AND operation. In this circuit, the TMR elements are used not only as memory elements but also as part of the operation circuit, whereby the logic-in-memory circuit 200 can be formed compactly with the integration of memory functions and operation functions.

FIGS. 10(*a*), 10(*b*) and 10(*c*) show a full-additional complementary TMR network that can be used for the TMR source coupled logic circuit 200 shown in FIG. 7(*b*). The complementary TMR network shown in FIGS. 10(*a*), 10(*b*) and 10(*c*) is adapted to have the simplest configuration by the foregoing approach for simplification of TMR network. FIG. 10(*a*) shows the configuration of a complementary TMR network 230 for calculating Carry signals, while FIG. 10(*b*) shows the configuration of another complementary TMR network 240 for calculating Sum signals.

It is noted that FIG. 10(*c*) shows a configuration based on common logic circuits.

(Dynamic Type TMR Source Coupled Logic Circuit)

In a practice using the TMR source coupled logic circuit according to FIG. 7(*a*), there is a problem that a steady-state current flows through the circuit to raise power consumption. To overcome the deficiency, a dynamic type current-mode logic circuit (DyCML) is utilized to form a dynamic type TMR source coupled logic circuit 300 shown in FIG. 11.

The dynamic type TMR source coupled logic circuit 300 consists of a TMR network 330 disposed between MOS transistors $Mn_{31}$, $Mn_{31}'$, $Mn_{32}$, $Mn_{32}'$, $Mn_{33}$ and $Mn_{34}$, which are turned on and off by clock signals CLK and bar CLK, and capacitors $C_1$, $C_2$ and $C_L$ inserted into current paths.

The circuit 300 in FIG. 11 includes two phases, one being a "precharge" phase where the capacitors $C_1$ and $C_2$ are charged by the clock signal CLK, and the other being an "evaluation" phase where charges are moved from the capacitors $C_1$ and $C_2$ to the capacitor $C_L$ and a threshold operation between currents I and I' flowing through the TMR network 330 is performed using a differential pair circuit. In each phase, since the circuit operates only in accordance with the charging and/or discharging of the capacitors, there flows no steady-state current, which enables power consumption to be restrained.

Another type of magnetoresistive element, e.g., giant magnetoresistive element (GMR element) may be used in the foregoing configuration.

(Multi-valued TMR Network)

Although binary TMR networks have been described above, it is also possible to form multi-valued TMR networks.

In a multi-valued TMR network circuit shown in FIG. 12, three logical operations are performed, separately, in TMR source coupled logic circuits 420, 430 and 440 for a four-value (0, 1, 2 and 3) input according, respectively, to whether the input value is either 1, 2 or 3, and then the operation results are added linearly to each other in an adder 460. The output of each of the TMR source coupled logic circuits 420, 430 and 440 has a weight of 1, 2 or 3, and the final output can be obtained by adding the weights to each other.

Also, within the TMR source coupled logic circuits 420, 430 and 440 are utilized multi-valued ferromagnetic tunnel junction (MTJ) elements.

A four-valued MTJ element 500 is shown in FIG. 13(*a*). There exist two ferromagnetic layers (free layers (1) and (2)) 510 and 530, respectively, at the upper and middle parts of the four-valued MTJ element 500, sandwiching a nonmagnetic layer (1) 520 therebetween. Then, a unidirectional magnetism is provided across a nonmagnetic layer (2) 540 in a fixed layer 550 and a diamagnetic layer 560. The four-valued MTJ element can be represented using a symbol similar to that in FIG. 2(*b*) as shown in FIG. 13(*b*).

The four-valued MTJ element 500 can have four kinds of resistance values, as shown in FIG. 13(*c*), by changing each of the spin directions in the ferromagnetic layers (free layers (1) and (2)) 510 and 530 externally.

The use of this element can have potential for realizing a more compact circuit compared with binary TMR element. For multi-valued ferromagnetic tunnel junction (MTJ) element, it is preferable to refer to documents such as T. Uemura and M. Yamamoto, "Proposal of Four-valued MRAM Based on MTJ/RTJ Structure," in Proc. IEEE Int. Symp. Multiple-Valued Logic, pp. 273–278, May 2003.

As an application of the above-mentioned TMR source coupled logic circuit can be cited CRAM (Computational RAM), which is useful in establishing highly parallel operation systems for image processing, etc, wherein local memories 612, 622 and 632 are connected, respectively, to processor elements (PE) 614, 624 and 634 as shown in FIG. 14(*a*), data being read out of the local memories 612, 622 and 632 to be used for operations in the processor elements 614, 624 and 634. For CRAM, it is preferable to refer to documents such as D. G. Elliott, M. Stumm, W. M. Snelgrove, C. Cojocaru, R. Mckenzie, "Computational RAM: Implementing Processors in Memory," in IEEE Design and Test of Computers, pp. 32–41, January–March 1999.

CRAM based on TMR source coupled logic circuit can configure PEs 712, 722 and 732 and memories in an integrated manner, respectively, in TMR networks 710, 720 and 730 as shown in FIG. 14(b). In this way, TMR source coupled logic circuit based configuration can integrate highly parallel operation functions and nonvolatile memory functions compactly, resulting in a substantial reduction in chip area. In addition, the nonvolatile memory function of TMR elements can hold memory without electricity supply, having potential for substantial reduction in leakage current during standby.

The invention claimed is:

1. A logic-in-memory circuit, comprising:
   a magnetoresistive effect network formed by a series-parallel connection of magnetoresistive elements with resistance values that change according to stored values and transistors with resistance values that change according to externally input values, the resistance value of said network being minimized for a particular combination of stored values and externally input values; and
   a threshold detection circuit for detecting the threshold value of current that flows through said magnetoresistive effect network, wherein the particular combination of stored values and externally input values is detected by said threshold detection circuit.

2. The logic-in-memory circuit according to claim 1, wherein said magnetoresistive effect network uses the fact that the resistance change of magnetoresistive elements is smaller than that of transistors to realize the particular combination of stored values and externally input values that minimizes the resistance value of said network with less number of magnetoresistive elements and transistors.

3. The logic-in-memory circuit according to claim 1, wherein said magnetoresistive effect network has two complementary outputs, a differential pair circuit being formed using said two outputs as current paths, and wherein said threshold value detection is performed by comparing currents flowing through each of said current paths with each other using said differential pair circuit.

4. The logic-in-memory circuit according to claim 3, wherein said differential pair circuit is a dynamic type one including two phases, one being a precharge phase where said differential pair circuit is driven by a clock signal to charge capacitors connected to said current paths, and the other being an evaluation phase where currents flowing through said magnetoresistive effect network are compared with each other using said stored charges to charge another capacitor.

5. The logic-in-memory circuit according to claim 1, wherein the magnetoresistive elements that form said magnetoresistive effect network are TMR elements.

6. The logic-in-memory circuit according to claim 1, wherein the magnetoresistive elements that form said magnetoresistive effect network are multi-valued TMR elements.

7. The logic-in-memory circuit according to claim 6, wherein said magnetoresistive effect network is formed by dividing a multi-valued input by weight except zero and differential pair circuits are formed for each magnetoresistive effect network in combination with inputs having weights of zero, the outputs of each differential pair circuit being added to each other to be output.

* * * * *